United States Patent [19]
Chu

[11] 4,080,620
[45] Mar. 21, 1978

[54] REVERSE SWITCHING RECTIFIER AND METHOD FOR MAKING SAME

[75] Inventor: Chang K. Chu, Pittsburgh, Pa.

[73] Assignee: Westinghouse Electric Corporation, Pittsburgh, Pa.

[21] Appl. No.: 632,433

[22] Filed: Nov. 17, 1975

[51] Int. Cl.² .................................................. H01L 29/74
[52] U.S. Cl. ............................................ 357/38; 357/20; 357/55; 357/68; 357/86; 307/252 A
[58] Field of Search ....................... 357/68, 20, 38, 86, 357/55; 307/252 A

[56] References Cited

U.S. PATENT DOCUMENTS

| | | | |
|---|---|---|---|
| 3,634,739 | 1/1972 | Borchert et al. | 357/38 |
| 3,858,236 | 12/1974 | Schafer et al. | 357/38 |
| 3,864,726 | 2/1975 | Schafer | 357/38 |

Primary Examiner—Stanley D. Miller, Jr.
Assistant Examiner—Joseph E. Clawson, Jr.
Attorney, Agent, or Firm—J. B. Hinson

[57] ABSTRACT

A reverse switching rectifier is described in which a PNPN semiconductor structure has a specially adapted N-type end zone or cathode-emitter zone. The N-type end zone penetrates to two different levels in the semiconductor body. A deep central portion and a shallow peripheral portion of the N-type end zone are produced by etching a cavity in the center of the body followed by diffusion of N-type dopant material. The exposed surfaces of the N-type end zone are then metallized to provide electrical and thermal contact thereto.

4 Claims, 11 Drawing Figures

REVERSE SWITCHING RECTIFIER AND METHOD FOR MAKING SAME

GOVERNMENT CONTRACT

This invention was made in the course of or under United States Air Force Contract F29601-74-C-0021.

BACKGROUND OF THE INVENTION

1. Field of the Invention

The present invention relates to semiconductor switching devices and more particularly to two terminal thyristor devices or reverse switching rectifier devices, hereinafter designated RSR devices.

2. Description of the Prior Art

RSR devices of the prior art have a general structural configuration shown in FIG. 1 wherein a body of semiconductor material in the form of a wafer 10 is doped to provide four alternate semiconductivity zones. An end zone 12 of P-type semiconductivity extends from one major surface 11 of the wafer 10 into the semiconductor material to meet a middle zone 14 of N-type semiconductivity. PN junction 13 is formed at the interface of zones 12 and 14. Similarly, P-type middle zone 16 forms PN junction 15 with zone 14. Zone 16 extends from PN junction 15 to end zone 18 of N-type semiconductivity located in an inner portion of the wafer 10 where PN junction 17 is formed. In addition, zone 16 typically extends past zone 18 to the outer portion of major surface 21. Zone 16 serves as the base of the device, and zone 18 serves as the emitter. Typically, a shorted emitter construction is used whereby a cathode electrode 22 is affixed to major surface 21 contacting the emitter zone 18 and a peripheral portion of the base zone 16 surrounding the emitter zone 18. The electrode 22 may be provided, for example, by aluminum deposition in a known manner. A supporting anode electrode 24 is affixed to major surface 11 to provide good electrical and thermal contact to zone 12 as well as to provide mechanical support for the wafer 10. Typical examples of metals used for the electrode 24 are molybdenum and tungsten, which are preferred for their favorable expansion properties. The wafer 10 has a beveled edge 25 produced in a known manner in order to optimize electrical characteristics. Disposed on the beveled edge 25 is an insulating and protective coating 26. The coating composition and manner of application is known in the art, a high temperature curing silicone varnish being an example of a suitable coating material.

The RSR device of the prior art shown in FIG. 1 operates as an electrical current switch. Briefly described, the RSR blocks voltage in both directions unless the device is turned on in which case it carries current in the forward direction as indicated by the arrow 27. The RSR device may be turned on in the presence of a forward voltage, as indicated by the polarity marks + and −, by impressing a forward voltage pulse across electrodes 24 and 22, which pulse has a sufficiently high DV/DT to cause the device to turn on.

It has been found that device structures of the prior art, as shown in FIG. 1, do not turn on uniformly along PN junction 15, rather such prior art devices initially turn on in a relatively small region located under an edge of the emitter zone 18 causing hot spotting and failure of the device. An example of a typical failure mode is illustrated in FIG. 1 in which emission of electrons from zone 18 into zone 16 more readily occurs in the dashed region 28 causing initial conduction of current through PN junction 15 to pass through the relatively small area of region 28 as illustrated by path 29. The very high current density along path 29 causes localized heating which permanently destroys the blocking capability of PN junction 15.

The present invention provides an RSR device which turns on uniformly thus eliminating the above-mentioned failure mode of prior art devices.

SUMMARY OF THE INVENTION

The present invention is a multi-layer semiconductor switching device comprising a body of semiconductor material and contacting means for making thermal and electrical contact to said body; said contacting means comprising a metal cathode electrode; said body comprising an emitter zone of a first type of semiconductivity disposed along a surface portion in contact with said metal cathode electrode, a base zone of a second type of semiconductivity disposed in said body adjacent to said emitter zone and forming a PN junction with said emitter zone, said emitter zone having a central portion and a peripheral portion surrounding said central portion, said peripheral portion extending into said body from said metal cathode electrode to a first level of said PN junction, said central portion extending into said body from said metal cathode electrode to a second level of said PN junction, said second level lying beyond said first level.

DESCRIPTION OF THE PREFERRED EMBODIMENTS

Figure 2:
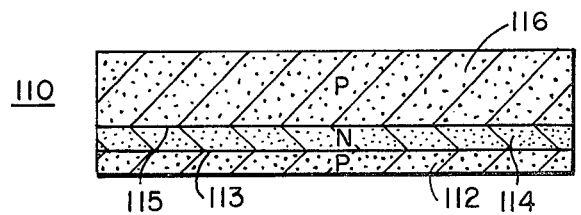

As illustrated by FIG. 2, a body of semiconductor material in the form of a wafer 110 is prepared with three layers of alternate semiconductivity type in a known manner. In a presently preferred embodiment, N-type silicon bar stock is sliced into wafers, each wafer then being subjected to P-type diffusion to produce a PNP wafer structure. For example, a boron, aluminum or gallium diffusion process may be used to produce outer zones 112 and 116 of P-type semiconductivity while inner zone 114 remains N-type semiconductivity. PN junctions 113 and 115 are thereby produced at the interfaces of the zones as shown. While not shown in FIG. 2, in actual practice, the boron or other P-type diffusant will penetrate the edge of the wafer 110 which necessitates subsequent processing to produce the desired structure.

Figure 3:
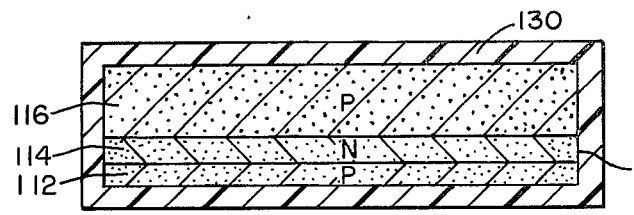

FIG. 3 shows the next step in the manufacturing process wherein the wafer 110 is subjected to an oxidizing ambient to produce a silicon dioxide layer 130 on all exposed surfaces.

Figure 4:
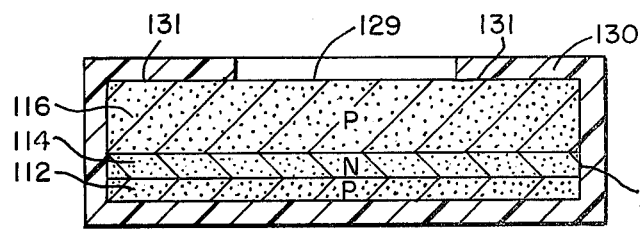

In FIG. 4, the structure is shown after an opening has been etched through the silicon dioxide layer 130 in a known manner which produces an exposed portion 129 and a covered portion 131 which comprise one of the two major surfaces of the wafer 110. In the presently preferred embodiment, circular geometries are employed due to the availability of various diameters of cylindrical-shaped silicon bar stock. Silicon bar stock is presently commercially available in various diameters up to a maximum of three inches. It is convenient to slice silicon bar stock into circular-shaped wafers and to dope the wafers in circular-shaped geometries. The present invention is not, however, limited to such circular geometries. Rather, these teachings may be readily applied to various other geometries and doping patterns.

Figure 5:
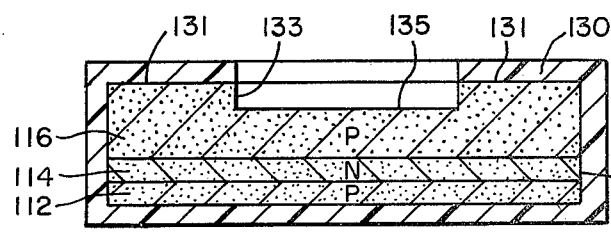

FIG. 5 illustrates the wafer 110 after surface 129 has been etched to produce a cavity or recess defined by cylindrical-shaped wall 133 and circular-shaped surface 135. A preferred depth of recessed surface 135 is about 5 microns, but a range of depths from 1 to 10 microns produce satisfactory results.

Figure 6:
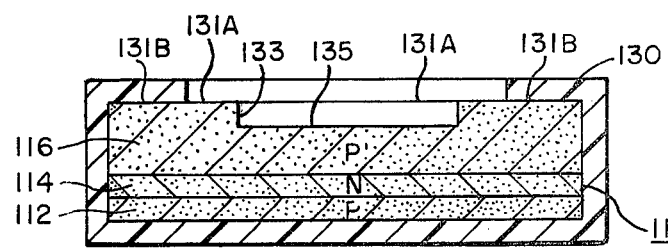

Next, the opening in the silicon dioxide layer 130 is increased in diameter as shown in FIG. 6 to expose an inner ring-shaped portion 131A of major surface 131 while outer surface portion 131B remains covered by layer 130.

Figure 7:
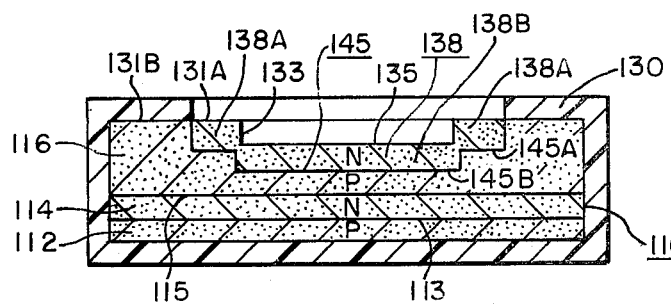

Next, an N-type diffusion is performed which produces a two-level emitter zone 138 of N-type semiconductivity as shown in FIG. 7. A presently preferred dopant is phosphorus, for which gaseous diffusion methods are well known. N-type emitter zone 138 forms PN junction 145 with P-type base zone 116. A peripheral portion 138A of zone 138 lying below surface 131A produces a first level of PN junction 145 designated by numeral 145A. A central portion 138B of zone 138 lying below surface 135 produces a second level of PN junction 145 designated by numeral 145B. First level 145A lies on the order of about 1 micron deeper than the depth of recessed surface 135. The distance between second level 145B and PN junction 115 is on the order of about 25 microns which varies somewhat in accordance with the desired electrical characteristics of the particular RSR device. Zone 138 has a preferred N-type dopant concentration on the order of $1 \times 10^{20}$ atoms/cm$^3$ along surfaces 131A, 133 and 135. Zone 116 has a preferred P-type dopant concentration on the order of $1 \times 10^{17}$ atoms/cm$^3$ along major surface 131A–131B. The N-type and P-type concentrations of zones 138 and 116 are equal along PN junction 145; the concentration being on the order of $4 \times 10^{16}$ atoms/cm$^3$ at first level 145A and $6 \times 10^{15}$ atoms/cm$^3$ at second level 145B. Presently preferred device characteristics may be achieved with doping concentration ranges from about $8 \times 10^{15}$ to about $8 \times 10^{16}$ at first level 145A and from about $3 \times 10^{15}$ to $8 \times 10^{15}$ at second level 145B.

Figure 8:
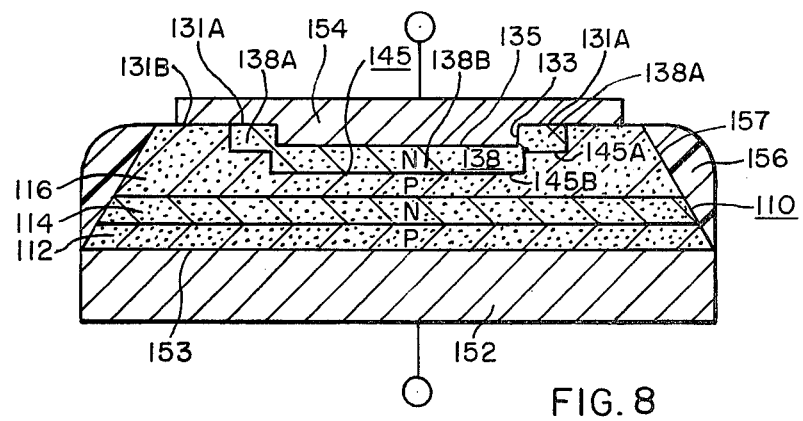
FIGS. 2–8 are vertical cross-sectional views of a device of the present invention at various stages in the manufacturing process.

FIG. 8 depicts a device of the present invention at the final stage in the manufacturing process wherein the silicon dioxide has been stripped from the wafer 110 and the edges of the wafer have been beveled in a known manner. Preferably at this stage, the surface area of major surface area of major surface portion 131A is about equal to that of major surface portion 131B. Additionally, it is preferred that the combined surface area of major surface 131A–131B is about equal to the surface area of recessed surface 135.

A supporting electrode 152 is fused to flat circular-shaped major surface 153 of the wafer 110 in a known manner thereby making good electrical and thermal contact to P-type zone 112. A metal cathode electrode 154, preferably aluminum, is deposited on the wafer 110 to make good electrical and thermal contact to N-type emitter zone 138 at surfaces 131A, 133 and 135. Electrode 154 likewise contacts a surface portion of P-type base zone 116 surrounding emitter zone 138 and designated by numeral 131B.

Figure 1:
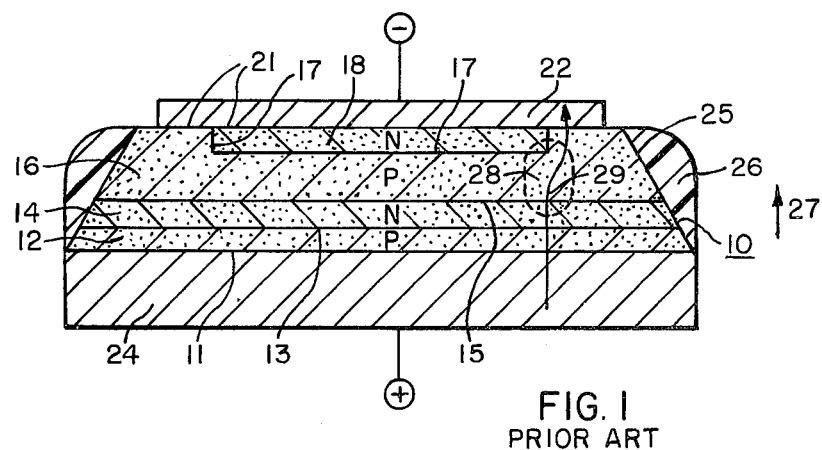
FIG. 1 is a vertical cross-sectional view of a device of the prior art.

By virtue of the electrical contact made at major surface 131A–131B, the PN junction 145 is shorted, thus providing the so-called "shorted emitter" arrangement. In addition, the P-type base zone 116 is also provided with shunts or shorts as described below and illustrated in FIGS. 9 and 10, which shunts pass through N-type emitter zone 138 to the electrode 154. Masking techniques for producing shunts are known in the art. Finally, an insulating protective coating 156 is applied to beveled edge 157 in like manner to the application of coating 26 of FIG. 1.

Test results show that the RSR structure of FIG. 8 will turn on in a uniform manner thus eliminating the hot spotting which caused prior art devices to fail. Such uniform turn-on is easily verified by use of an infrared radiation detection apparatus.

Figure 9:
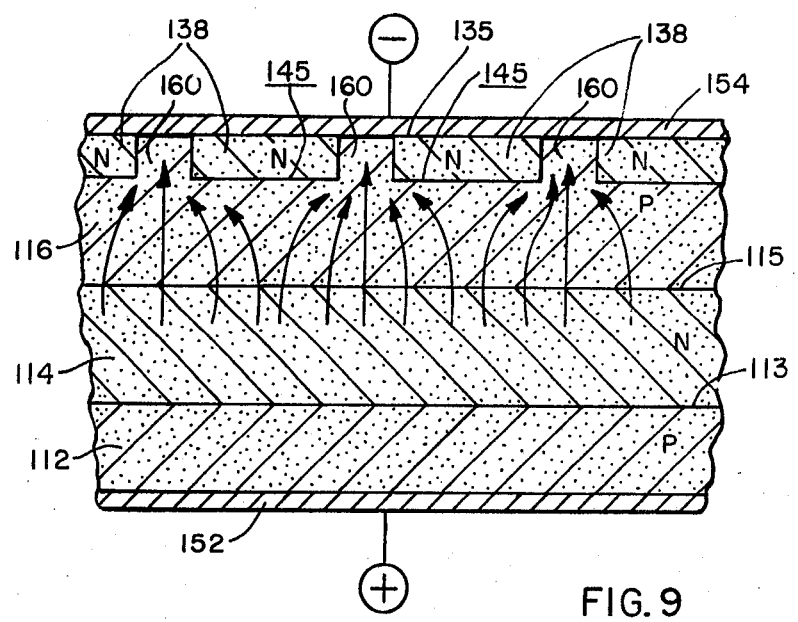
FIG. 9 is a greatly enlarged cross-sectional view of a portion of the device of FIG. 8.

A more detailed explanation of the operation of the present invention will now be given with the aid of FIGS. 9 and 10. FIG. 9 shows cylindrical-shaped shunts 160 of P-type semiconductivity which pass through zone 138 and make contact with electrode 154 at recessed surface 135 (and at major surface portion 131A not shown in FIG. 9). The shunts 160 are produced by masking surfaces 131A and 135 with silicon dioxede prior to the diffusion step of FIG. 7.

Figure 10:
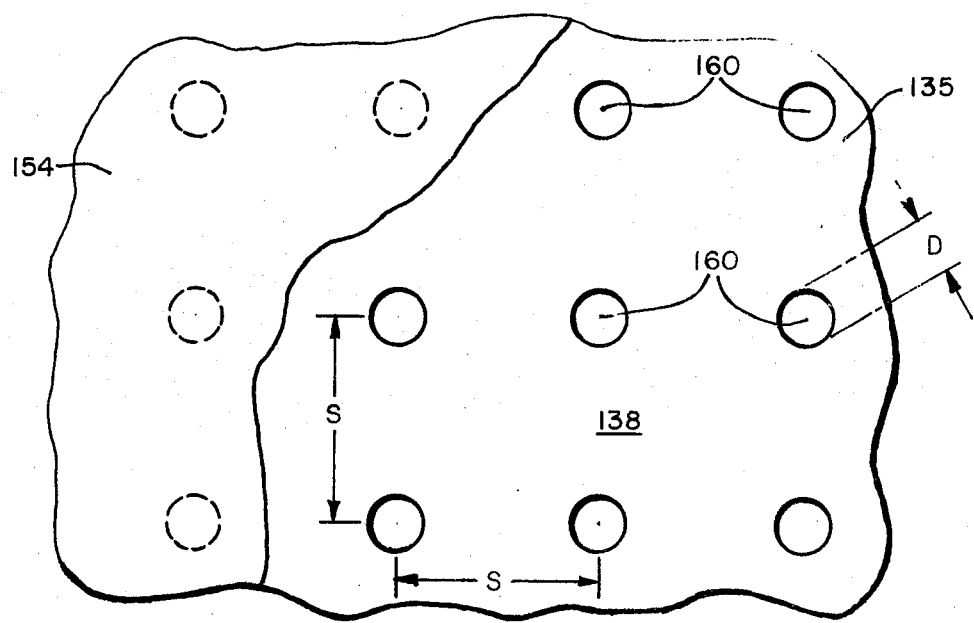
FIG. 10 is a greatly enlarged paln view of the semiconductor surface illustrating the relative positioning of shunts.

FIG. 10 illustrates a plan view of a preferred shunt pattern showing surface 135 after the N-type diffusion of zone 138. Each shunt 160 has four nearest neighbors, a preferred center-center separation distance S being 20 mils, and a preferred diameter D being 5 mils. Satisfactory results may be achieved with S in the range from about 10 to about 35 mils and D in the range from about 3 to about 11 mils with larger diameters requiring a corresponding larger separation distance.

Referring again to FIG. 9, a forward bias voltage, applied to the device in the polarity shown, reverse biases PN junction 115 which blocks all but a small leakage current shown schematically by the arrows. The leakage current flows to the cathode electrode 154 through the shunts 160 which current creates a voltage differential between P-type base zone 116 and N-type emitter zone 138. As the leakage current increases with increasing forward bias, the base-emitter voltage eventually reaches a critical voltage, which for silicon devices is between about 0.5 volts and 0.6 volts. When this critical voltage is exceeded, the emitter zone 138 begins emitting electrons into the base zone 116 which traverse PN junction 115, causing the device to turn on or fire in a manner known to those skilled in the art. In order to fire the RSR device at a predetermined time, a high dv/dt control pulse is impressed across the device in the forward direction. Since the leakage current passes through each shunt 160, the critical voltage to fire is reached simultaneously across the area of the emitter zone 138. Therefore, initial conduction of current occurs uniformly through the emitter zone 138.

Referring again to FIG. 8, edge firing is inhibited since the impedance path through peripheral portion 138A of zone 138 is higher than the impedance path through central portion 138B of zone 138. It is known that impedance is proportional to the ratio of dopant concentrations. The impedance from the base zone 116 to the cathode electrode 154 is lowest through central portion 138B since the ration of N-type to P-type dopants is highest along surface 135. As previously discussed, the N-type concentration is the same along surfaces 131A, 133 and 135 while the P-type concentration is highest at major surface 131A–131B and drops off to a lower value at recessed surface 135 which drop-off is the natural result of the diffusion process. The above differences in concentrations are produced by etching away the high surface concentrations of P-type diffusant in the step of FIG. 5.

The favorable N to P ratio in the central portion 138B of emitter zone 138, combined with the multiplicity of shunts 160, produces an RSR device which fires uniformly. It will be apparent to those skilled in the art that the presently preferred embodiment of the present invention achieves a novel advance in the state of the art of RSR devices which overcomes the edge firing failure mode of prior art devices. It will be further apparent that a complementary device may be produced by interchanging the P and N regions of the above-described device.

While the above described embodiment is the best mode presently contemplated by the inventor of carrying out his invention, an alternate embodiment is described below in conjunction with FIG. 11.

Figure 11:
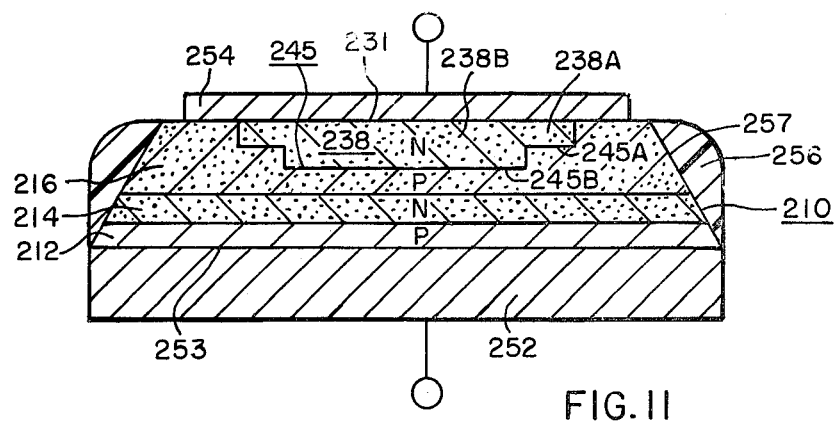
FIG. 11 is a vertical cross-sectional view of another device embodiment.

In comparing FIG. 11 with FIG. 8, it will be seen that the alternate of FIG. 11 differs only in the shape of the emitter zone and associated position of the cathode electrode. The emitter zone 238 of FIG. 11 is a two level zone consisting of deep central portion 238B and shallow peripheral portion 238A, with portions 238A and 238B both terminating at major surface 231. Cathode electrode 254 makes contact with base zone 216 and emitter zone 238 at major surface 231 as shown. The device of FIG. 11 is similar to the device of FIG. 8 in all other respects, similar numerals depicting similar portions of the devices.

In operation, the device of FIG. 11 does not have the highly favorable N to P ratio in the central portion of the emitter zone as achieved at surface 135 of the device of FIG. 8; however, both the devices of FIG. 8 and FIG. 11 share the feature of a shallow peripheral portion of the emitter zone. Shallow peripheral portions 138A of FIG. 8 and 238A of FIG. 11 tend to inhibit the edge firing failure mode of the prior art device shown in FIG. 1. It has been found that both the device embodiments of FIGS. 8 and 11 are significantly more reliable than the prior art device of FIG. 1, with the embodiment of FIG. 8 being most superior.

In order to produce the embodiment of FIG. 11, a method similar to the method of producing the embodiment of FIG. 8 is employed. The steps of FIGS. 2, 3 and 4 are identical, but the step of FIG. 5 is eliminated, a diffusion step forming central portion 238B being performed instead. Next, the opening in the silicon dioxide is widened in similar fashion to the step of FIG. 6. A second diffusion step is then performed which produces peripheral portion 238A of two level emitter zone 238 of FIG. 11. The remaining steps are substantially the same as those which produce the device embodiment of FIG. 8.

What is claimed is:

1. A two-terminal multilayer semiconductor switching device comprising a body of semiconductor material and contacting means for making thermal and electrical contact to said body; said contacting means comprising a metal cathode electrode; said body comprising an emitter zone of a first type of semiconductivity disposed along a surface portion in contact with said metal cathode electrode, a base zone of a second type of semiconductivity disposed in said body adjacent to said emitter zone and forming a PN junction with said emitter zone, said metal cathode electrode extending to contact said base zone, said emitter zone having a central portion and peripheral portion surrounding said central portion, said peripheral portion extending into said body from said metal cathode electrode to a first level of said PN junction, with the portion of said base zone forming a PN junction with said central portion of said emitter zone having a first selected doping concentration and the portion of said base zone forming a PN junction with said peripheral portion of said emitter zone having a selected second doping concentration, said second doping concentration being greater than said first selected doping concentration, said central portion extending into said body from said metal cathode electrode to a second level of said PN junction, said second level lying beyond said first level to form a semiconductor switching device which switches from a non conducting to a conducting state when a voltage having a selected change in amplitude with time is coupled to said two terminals such that the turn on characteristic of said emitter zone is substantially uniform.

2. The device of claim 1 wherein said body has a cavity formed by cylindrical shaped walls extending from a major surface to a recessed surface at a predetermined depth in said body, said recessed surface being adjacent to said central portion of said emitter zone, and said metal cathode electrode makes contact with said central portion of said emitter zone at said recessed surface and with said peripheral portion of said emitter zone at said major surface.

3. The device of claim 2 wherein said metal cathode electrode makes contact with a surface portion of said base zone surrounding said emitter zone, and a multiplicity of shunts of P-type semiconductivity extend from said base zone to said metal cathode electrode through said emitter zone, said shunts being spaced at regular intervals throughout said emitter zone.

4. The device of claim 2 wherein said recessed surface preferably lies at a predetermined depth from said major surface of about 15 microns.

* * * * *